(12) United States Patent
Anderson et al.

(10) Patent No.: US 8,791,778 B2
(45) Date of Patent: Jul. 29, 2014

(54) VERTICAL INTEGRATED CIRCUIT SWITCHES, DESIGN STRUCTURE AND METHODS OF FABRICATING SAME

(71) Applicant: International Business Machines Corporation, Armonk, NY (US)

(72) Inventors: Felix P. Anderson, Colchester, VT (US); Edward C. Cooney, III, Jericho, VT (US); Thomas L. McDevitt, Underhill, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/027,768

(22) Filed: Sep. 16, 2013

(65) Prior Publication Data
US 2014/0014480 A1  Jan. 16, 2014

Related U.S. Application Data

(62) Division of application No. 12/426,561, filed on Apr. 20, 2009, now Pat. No. 8,604,898.

(51) Int. Cl.
*H01H 51/22* (2006.01)

(52) U.S. Cl.
USPC ............................................. 335/78; 200/181

(58) Field of Classification Search
USPC ....................... 335/78; 200/181; 977/724, 742
See application file for complete search history.

(56) References Cited

U.S. PATENT DOCUMENTS

| | | |
|---|---|---|
| 5,578,976 A | 11/1996 | Yao |
| 6,127,812 A | 10/2000 | Ghezzo et al. |
| 6,534,839 B1 | 3/2003 | Frazier et al. |
| 6,583,031 B2 | 6/2003 | Lin |
| 6,605,043 B1 | 8/2003 | Dreschel et al. |
| 6,621,390 B2 | 9/2003 | Song et al. |
| 6,625,047 B2 | 9/2003 | Coleman, Jr. |
| 6,646,215 B1 | 11/2003 | Nelson |
| 6,761,829 B2 | 7/2004 | Harris et al. |
| 6,833,597 B2 | 12/2004 | Blasko, III |
| 6,872,984 B1 | 3/2005 | Leung |

(Continued)

FOREIGN PATENT DOCUMENTS

| | | |
|---|---|---|
| CN | 1747891 A | 3/2006 |
| JP | 2010157469 A | 7/2010 |

(Continued)

OTHER PUBLICATIONS

Chinese Patent Office Action for Appl. No. 201010167452.0 dated Oct. 8, 2012.

(Continued)

*Primary Examiner* — Bernard Rojas
(74) *Attorney, Agent, or Firm* — Anthony Canale; Roberts Mlotkowski Safran & Cole, P.C.

(57) ABSTRACT

Vertical integrated MEMS switches, design structures and methods of fabricating such vertical switches is provided herein. The method of manufacturing a MEMS switch, includes forming at least two vertically extending vias in a wafer and filling the at least two vertically extending vias with a metal to form at least two vertically extending wires. The method further includes opening a void in the wafer from a bottom side such that at least one of the vertically extending wires is moveable within the void.

9 Claims, 14 Drawing Sheets

(56) References Cited

U.S. PATENT DOCUMENTS

| | | |
|---|---|---|
| 6,917,268 B2 | 7/2005 | Deligianni et al. |
| 6,924,538 B2 * | 8/2005 | Jaiprakash et al. ........... 257/415 |
| 6,936,780 B2 | 8/2005 | Zhang et al. |
| 6,953,985 B2 | 10/2005 | Lin et al. |
| 7,026,697 B2 | 4/2006 | Sherrer |
| 7,053,456 B2 | 5/2006 | Matsuo |
| 7,145,213 B1 | 12/2006 | Ebel et al. |
| 7,187,489 B2 | 3/2007 | Miles |
| 7,215,229 B2 | 5/2007 | Shen et al. |
| 7,250,315 B2 | 7/2007 | Miles |
| 7,253,709 B1 | 8/2007 | Chang et al. |
| 7,259,449 B2 | 8/2007 | Floyd |
| 7,261,826 B2 | 8/2007 | Adams et al. |
| 7,265,429 B2 | 9/2007 | Wan |
| 7,270,591 B2 | 9/2007 | Deshpande et al. |
| 7,276,789 B1 | 10/2007 | Cohn et al. |
| 7,280,015 B1 | 10/2007 | Schaffner et al. |
| 7,288,739 B2 | 10/2007 | Gregory |
| 7,348,591 B2 * | 3/2008 | Yamauchi et al. ................. 257/9 |
| 7,355,258 B2 | 4/2008 | Valenzuela et al. |
| 7,612,270 B1 * | 11/2009 | Zhu ................................ 257/314 |
| 2003/0223174 A1 | 12/2003 | Prophet |
| 2005/0170656 A1 | 8/2005 | Nasiri et al. |
| 2007/0051970 A1 * | 3/2007 | Jang et al. ..................... 257/108 |
| 2007/0128831 A1 | 6/2007 | Oka et al. |
| 2008/0061351 A1 * | 3/2008 | Jang et al. ..................... 257/315 |

FOREIGN PATENT DOCUMENTS

| | | |
|---|---|---|
| TW | I230426 B | 4/2005 |
| TW | I248194 B | 1/2006 |
| TW | I257129 B | 6/2006 |
| TW | I258814 B | 7/2006 |
| WO | 2005122194 A1 | 12/2005 |

OTHER PUBLICATIONS

Osterberg et al., "M-TEST: A Test Chip for MEMS Material Property Measurement Using Electrostatically Actuated Test Structures", Journal of Microelectromechanical Systems, vol. 6, No. 2, Jun. 1997, pp. 107-118.

* cited by examiner

Contact

VERTICAL INTEGRATED CIRCUIT SWITCHES, DESIGN STRUCTURE AND METHODS OF FABRICATING SAME

FIELD OF THE INVENTION

The invention relates to vertical integrated circuit switches and methods of manufacturing, and more particularly, to vertical integrated MEMS switches, design structures and methods of fabricating such vertical switches.

BACKGROUND

Integrated circuit switches used in 3D and other integrated circuits can be formed from solid state structures (e.g., transistors) or passive wires (MEMS). MEMS switches are typically employed because of their almost ideal isolation, which is a critical requirement for wireless radio applications where they are used for mode switching of power amplifiers (PAs) and due to their low insertion loss (i.e. resistance) at frequencies of 10 GHz and higher. MEMS switches can be used in a variety of applications, primarily analog and mixed signal applications. One such example is cellular telephone chips containing a power amplifier (PA) and circuitry tuned for each broadcast mode. Integrated switches on the chip would connect the PA to the appropriate circuitry so that one PA per mode was not required.

MEMS can be manufactured in a number of ways using a number of different tools. In general, though, the methodologies and tools are used to form small structures with dimensions in the micrometer scale with switch dimensions of approximately 5 microns thick, 100 microns wide, and 200 microns long. Also, many of the methodologies, i.e., technologies, employed to manufacture MEMS have been adopted from integrated circuit (IC) technology. For example, almost all MEMS are built on wafers and are realized in thin films of materials patterned by photolithographic processes on the top of the wafer. More specifically, the fabrication of MEMS use three basic building blocks: (i) deposition of thin films of material on a substrate, (ii) applying a patterned mask on top of the films by photolithographic imaging, and (iii) etching the films selectively to the mask. In any of these methodologies, the switches are fabricated in a horizontal orientation above the wafer/chip.

Depending on the particular application and engineering criteria, MEMS structures can come in many different forms. For example, MEMS can be realized in the form of a single cantilever structure such as, for example, shown in U.S. Pat. No. 5,578,976. In this cantilever application, a single cantilever arm (suspended electrode) is pulled toward a fixed electrode by application of a voltage. To manufacture such a cantilever structure, though, several extra and expensive processing steps are required, in addition to the building of the CMOS structure itself. For example, once all of the CMOS wiring is completed, additional process steps are required to form the MEMS switch, which adds considerable processing costs to the structure.

Also, as clearly shown in such application, the MEMS are horizontal cantilever type switches fabricated above the wafer/chip. These horizontal cantilever type switches are known to add costs to the fabrication of the device, as well as adding to package interaction issues. In addition, horizontal cantilever type switches, in many current applications, are known to stick, e.g., exhibit an inability to open the switch due to freezing closed during processing and the relatively small contact or actuation gap used in the switch, which on the order of 1 micron. This is known as sticktion.

Additionally, in known applications, the voltage required to pull the suspended electrode down to the fixed electrode by electrostatic force may be high. This has been seen to cause unwanted charging on the insulator after prolonged use and eventual failure of the switch. In certain applications, the high voltage, e.g., 100 volts, is also difficult to obtain since this has to be stepped up from about 1.5-5 volts to 30 to 100 volts using charge pumping or similar methods. The minimum voltage required for switching is called pull-in voltage, which is dependent on several parameters including the length of the suspended electrode, spacing or gap between the suspended and fixed electrodes, and spring constant of the suspended electrode, which is a function of the materials and their thickness.

Reducing the pull-in voltage without decreasing the gap and without softening the spring is desirable, as the spring provides the restoring force and determines the switching speed. In U.S. Pat. No. 7,265,429, a pair of side parallel-plate electrostatic actuators is implemented for lowering or eliminating of the bias voltages. These additional electrostatic actuators are used to reduce or eliminate the bias voltage to be applied on the fixed signal electrode. In implementation, the fixed electrode of the side parallel-plate electrostatic actuators can be elevated above a fixed signal electrode. Thus due to a smaller gap, the pull-in voltage required to pull the suspended electrode down to the fixed electrode can be lowered. However, the MEMS shown in U.S. Pat. No. 7,265,429 are not hermetically sealed, and the additional electrostatic actuators can increase fabrication costs. Also, the MEMS are horizontal cantilever type switches fabricated above the wafer/chip.

Accordingly, there exists a need in the art to overcome the deficiencies and limitations described hereinabove.

SUMMARY

In an aspect of the invention, a method of manufacturing a switch comprises: forming at least two vertically extending vias in a wafer; filling the at least two vertically extending vias with a metal to form at least two vertically extending wires; and opening a void in the wafer from a bottom side such that at least one of the vertically extending wires is moveable within the void.

In an aspect of the invention, a method of manufacturing a MEMS switch comprises: etching at least three vias from a top side of a wafer; filling the vias with a metal to form vertically arranged top side wires; depositing a dielectric material on the bottom side of the wafer; etching the dielectric material to form an opening therein, wherein remaining portions of the dielectric material protect edges of the wafer; and etching a bottom side of the wafer through the opening in the dielectric material to form a void which exposes at least one of the vertically arranged top side wires.

In an aspect of the invention, a MEMS switch comprises: at least three vertically extending metal wires formed in a wafer; and a void formed in the wafer which accommodates at least one of the at least three vertically extending metal wires. The at least one of the at least three vertically extending metal wires is moveable within the void upon an application of a voltage.

In another aspect of the invention, a design structure embodied in a machine readable medium for designing, manufacturing, or testing an integrated circuit is provided. The design structure comprises the structures and/or methods of the present invention.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to vertical integrated circuit switches and methods of manufacturing, and more particularly, to vertical integrated MEMS switches, design structures and methods of fabricating such vertical switches. In implementation, the invention includes methods and structures of several novel MEMS switches. The MEMS switches are fabricated in a vertical orientation to form vertical switches in a silicon substrate, either in a silicon carrier-type application (i.e., under the integrated circuit (IC) but in the same substrate) or as a stand alone switch coupled to a separate chip. In embodiments, the structures, e.g., MEMS switches, are formed through silicon wafer vias in a vertical orientation with the vias either, for example, (i) only on the wafer front side but exposed on the wafer backside or (ii) vias formed both on the wafer top side and backside, but exposed on the wafer backside. Advantageously, the vertical MEMS switches of the present invention eliminate the inability of the switch to open due to freezing closed during processing.

As discussed in greater detail below, MEMS contact switch functionality is defined by a pull-in voltage and an actuation voltage. The pull-in voltage is defined by the applied actuator voltage needed for the beam to bend and make contact and the actuation voltage is the applied voltage in MEMS switch circuit, which by definition is greater than the pull-in voltage. With this understanding, the structures of the several aspects of the invention include an actuation gap (AG) and contact gap (CG) (See, e.g., FIG. 11). The actuation gap (AG) is the separation between the actuator and the moveable beam. The contact gap (CG) is the separation between the movable beam and the contact. To avoid shorting, which would result in arcing and potential destruction of the MEMS switch, the contact gap (CG) is typically less than the actuation gap (AG).

First Aspect of the Invention

Figure 1A:
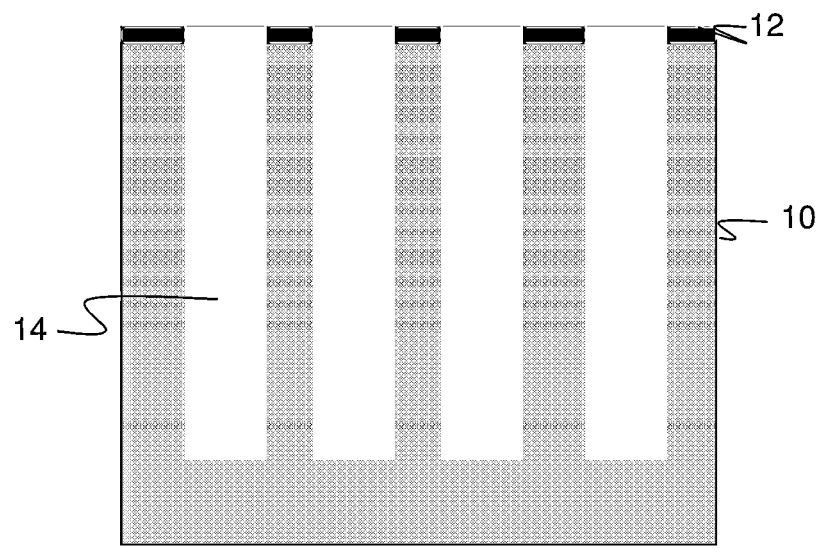
FIGS. 1a-1g show MEMS structures and respective processing steps in accordance with a first aspect of the invention.

FIGS. 1a-1g show structures and respective processing steps in accordance with a first aspect of the invention. More specifically, FIG. 1a shows a starting structure comprising a wafer 10 having a dielectric layer 12 on the top side of the wafer. In embodiments, the wafer 10 can be silicon, non-crystalline BULK materials, silicon on insulator, (SOI) SiGe, quartz, sapphire, alumina, glass or Gallium arsenide, to name a few. In embodiments, the dielectric layer 12 is $SiO_2$. The dielectric layer 12 could be deposited using any known method, such as plasma-enhanced chemical vapor deposition (PECVD).

As further shown in FIG. 1a, vias 14 are formed in the wafer 10, using conventional photolithographic processes. In embodiments, four vias 14 are shown, which will be used to form the vertical switch of the first aspect of the invention. The vias 14, in embodiments, can be about 150 microns deep, about 3 microns in width and about 20 microns in length (i.e., as measured into the figure). Those of skill in the art will recognize that other dimensions are also contemplated by the invention, depending on the particular application of the switch. For example, shortening the vias would increase the spring constant of the switch, resulting in increased pull-in voltage. The vias 14 are formed in the front side of the wafer 10.

By way of one example, the vias 14 are formed by first depositing a resist on the dielectric material 12. Selective portions of the resist are exposed to form openings. In subsequent processes, the dielectric material 12 and wafer 10 are etched using a conventional process such as, for example, reactive ion etching (RIE) to form vias 14. Perfluorcarbon-based RIE processes can be used to etch dielectrics. If the substrate is silicon, then Bosch RIE processes can be used to etch nearly vertical trenches in the silicon. The resist can be stripped away using wet or dry methods, such as downstream oxygen plasma processes.

Figure 1B:
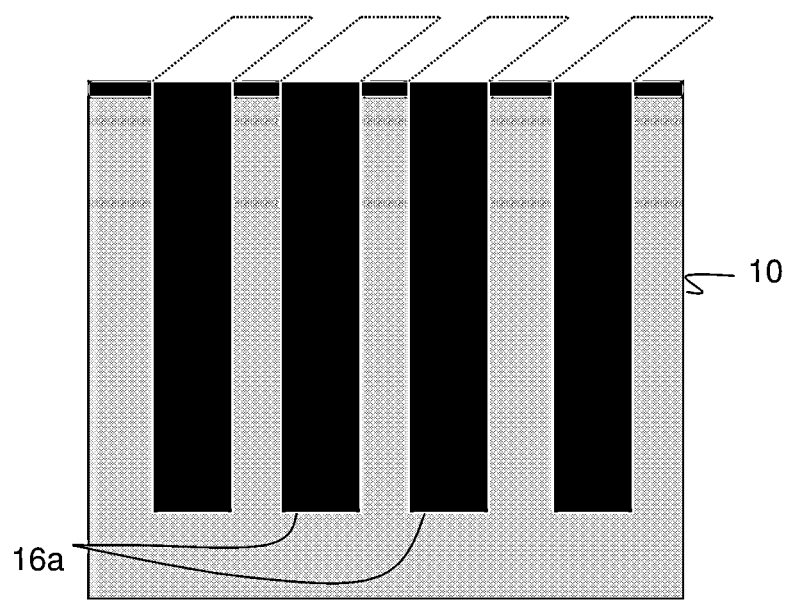

In FIG. 1b, the vias are filled with known metals or metal alloys to form wires 16. In embodiments, the wires 16 can be metallized using any known combination of processes such as, for example, physical vapor deposition (PVD), chemical vapor deposition (CVD), atomic layer deposition (ALD), electroplated deposition (ECP), metal-organo chemical vapor deposition (MOCVD), etc. In one exemplary embodiment, the wires can be tungsten with TiN liners, both preferably deposited using CVD. In another embodiment, the wires 16 are formed using copper with refractory liners composed of TaN/Ta, TaN/Ru, etc. Refractory liners can be deposited using CVD or physical vapor deposition (PVD) and Cu can be deposited using, for example, a combination of PVD and ECP. In another embodiment, the wires 16 are AlCu or other combinations of Al or Cu. The wires 16, in embodiments, can be about 150 microns deep, about 3 microns in width and about 20 microns in length (i.e., as shown by the dashed lines). Those of skill in the art will recognize that other dimensions are also contemplated by the invention, depending on the particular dimensions of the vias. After metal deposition, planarization processes such as chemical-mechanical polishing (CMP), RIE etch back, or a combination of these are used to remove excess metal from the wafer surface leaving damascene metal filled trenches. After the trenches are metalized, the wafer front side is optionally processed through standard BEOL contacts, vias, wires, passive elements, memory elements, etc. as known in the art.

Figure 1C:
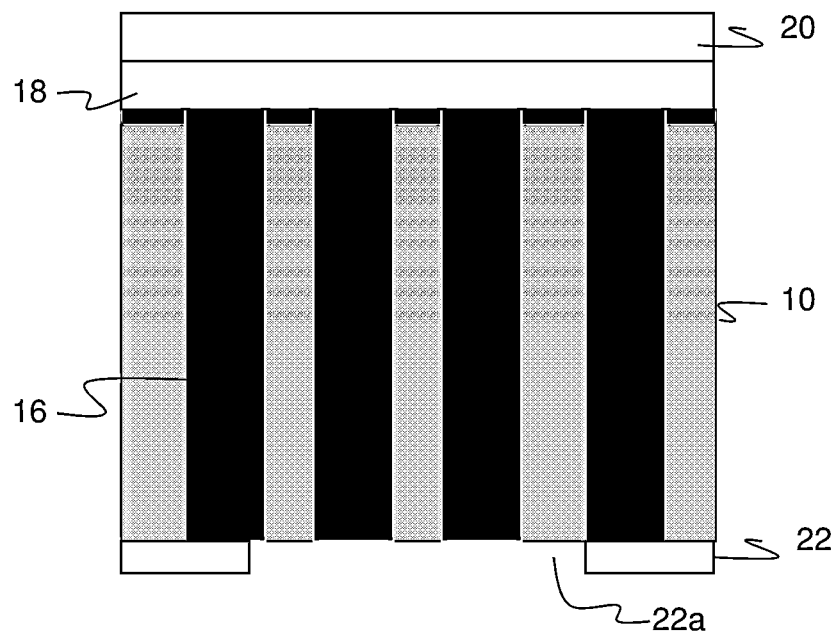

In FIG. 1c, an adhesive 18 is deposited on the structure of FIG. 1b. More specifically, the adhesive 18 which can be removed later in the process is formed on the dielectric material 12 and exposed portions of the wafer front side. A carrier 20 composed of glass, silicon, or any known material which can provide mechanical support to the wafer, is attached to the adhesive 18.

In FIG. 1c, those of skill in the art should recognize that the structure can include contacts, wires, vias and/or passive elements such as capacitors above the dielectric material 12. Also, the invention further contemplates active and/or passive elements, etc. under the dielectric material 12. The elements, e.g., passive and active devices, wires, etc. can be used to provide voltage to actuate the MEMS, input and/or output pads for the MEM, or non-MEM related functions. These different variants are contemplated for each of the aspects of the invention described herein, as should be understood by those of skill in the art.

FIG. 1c also shows a grinding process to expose a bottom portion of the wires. More specifically, using a conventional grinding process such as, for example, a chemical mechanical polish (CMP) process, the backside of the wafer 10 is ground down from it's starting thickness of, for example, 725 microns to 150 microns, which exposes the wires 16 on the backside of the wafer 10. In embodiments, the resultant wafer 10 is approximately 100 microns to 150 microns; although other dimensions are contemplated by the invention. In any of the embodiments, the wires 16, on the backside of the wafer 10, are exposed. A dielectric material 22 is deposited on the backside of the wafer 10, and lithographically patterned and etched to form an opening 22a. The dielectric material 22 can be, for example, $SiO_2$. The opening 22a exposes the inner wires 16 on the backside of the wafer 10.

Figure 1D:
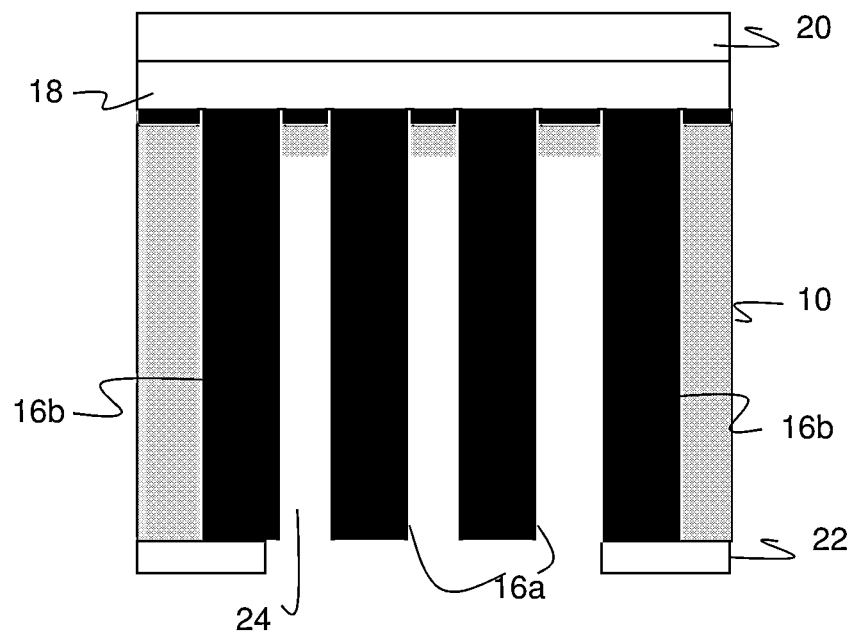

In FIG. 1d, the exposed wafer 10 is etched to form an open void 24. In embodiments, the wafer 10 can be etched using, for example, a combination of wet and dry etching processes. In embodiments, the substrate wafer 10 is silicon and the open void 24 is etched using one or more of a wet heated potassium hydroxide (KOH) solutions, a XeF2 non-plasma etch, or a non-selective Bosch plasma etch . In embodiments, the dielectric material 22 will protect outer portions of the wafer 10 to such an extent that at least one side of the outer wires 16b remain attached (fixed) to the material of the wafer 10; whereas, the inner wires 16a are substantially exposed in the void 24 in order to allow movement thereof.

Figure 1E:
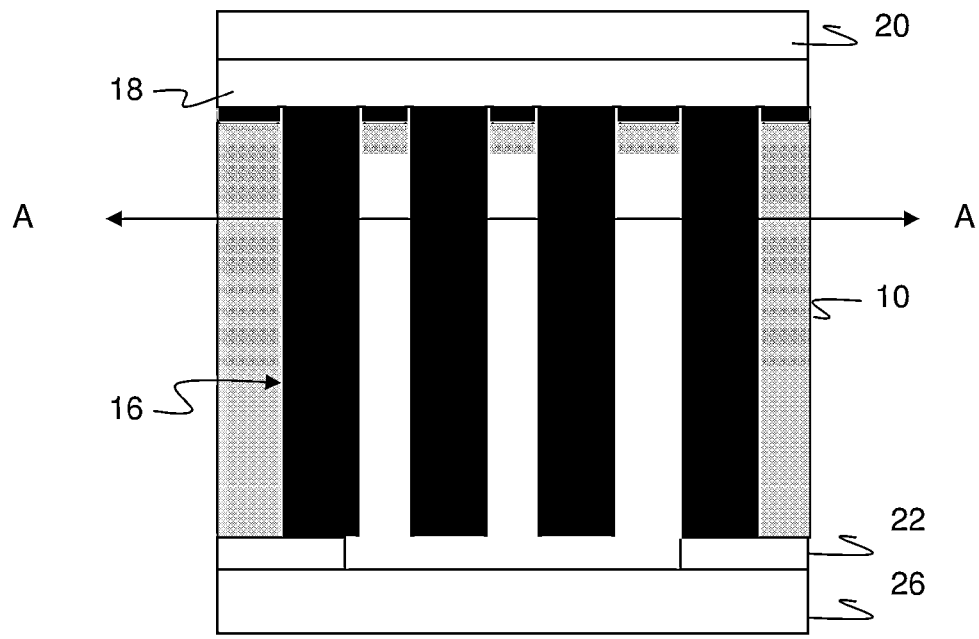

In FIG. 1e, an optional wafer cap 26 is bonded to the underside of the wafer 10. More specifically, the wafer cap 26 is bonded to the dielectric material 22 to create a hermetic seal. The wafer cap 26 can be, for example, a glass or silicon substrate. The wafer cap 26 can be bonded to the dielectric material 22 using any conventional bonding process, such as one using an adhesive.

Figure 1F:
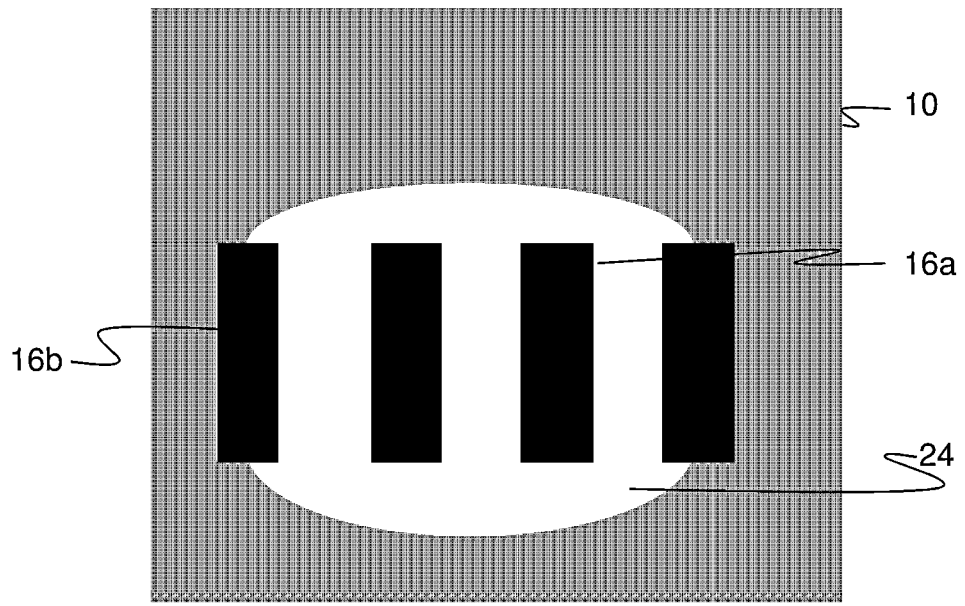

FIG. 1f shows a cross-sectional view of the structure of FIG. 1e, along line A-A. This view more clearly shows the length of the wires, e.g., about 20 to 100 microns. This view also shows at least one side of the outer wires 16b remain attached (fixed) to the material of the wafer 10; whereas, the inner wires 16a are substantially exposed in the void 24 in order to allow movement thereof. Those of skill in the art would recognize that a three micron thick switch movable electrode would have an actuation gap of approximately one micron.

Figure 1G:
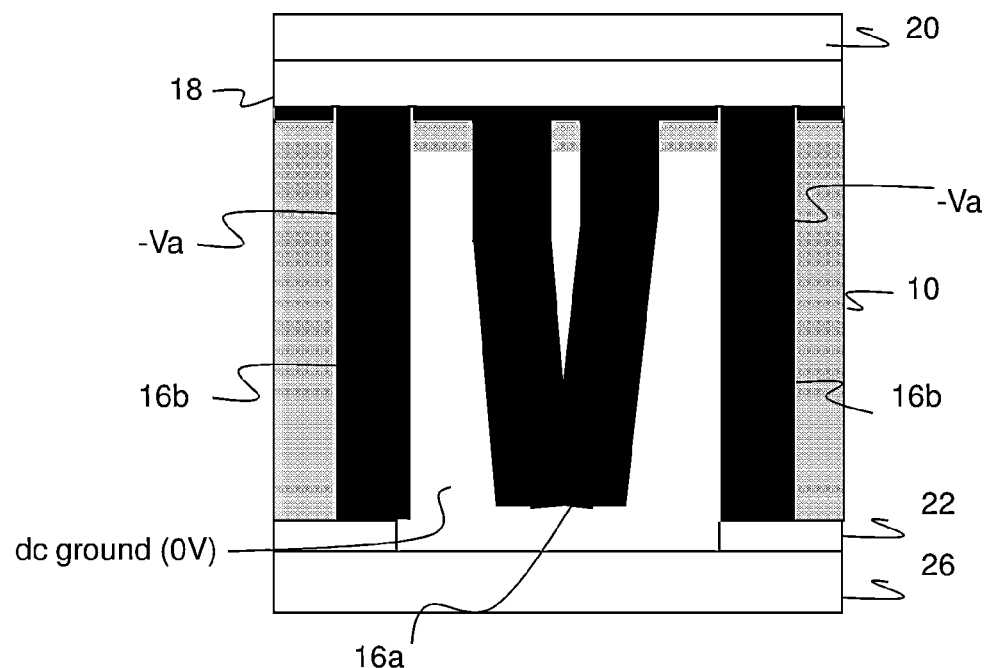

FIG. 1g shows the switch of the first aspect of the invention in the closed position. In this embodiment, an actuation voltage, Va, is applied to the fixed wires 16b. This results in a coulomb repulsion force which pushes the inner wires 16a into contact with one another. This effectively closes the switch, e.g., moves the inner, freely floating wires 16a into contact. In embodiments, the actuation voltage should be a voltage which overcomes the pulling voltage, e.g., greater than the pulling voltage. Depending on the embodiments, the pulling voltage can be, for example, 20V to 60V (or minus 20V to 60V). In embodiments, the actuation voltage Va is −100 volts applied to the fixed wires 16b.

For MEMS contact switches, the movable electrode or electrodes 16a are usually wired to a dc ground. This dc ground connection (not shown) can either be a dc and rf ground, using a simple low resistance wire; or can be a dc ground and rf open, using, for example, an inductor which has low impedance at dc but high impedance at rf frequencies. If the movable electrode or electrodes are not wired to a dc ground, then such electrodes can capacively charge up from the actuation voltage, resulting in undesirable pull-in voltage variability.

Although two actuation electrodes 16a are shown, it is further contemplated that only one actuation electrode 16a is required. For example, either of the actuation electrodes 16a can be removed from FIG. 1g (or other aspects of the invention). In such embodiments, upon an activation voltage (Va), the remaining actuation electrode would bend and make contact with the closest fixed wire.

It should be recognized by those of skill in the art that the contacting wires, in each aspect of the invention, will have some degree of vertical overlap with one another. This ensures that upon an applied voltage, the freely moving wire (s) will make contact and hence close the switch. Also, unless otherwise specified as freely floating, moving, etc. wires remain stationary in the structure. Additionally, with some modifications and/or additions to the processes described herein, e.g., patterning, metallization and/or deposition processes, the processes of FIGS. 1a-1g can be used to fabricate any of the embodiments described herein. Although such modifications and/or additions should become obvious to those of skill in the art after an explanation of each of the embodiments, some further explanation of the additional and/or modified processes are described herein as necessary for a more thorough understanding of the invention.

Second Aspect of the Invention

Figure 2A:
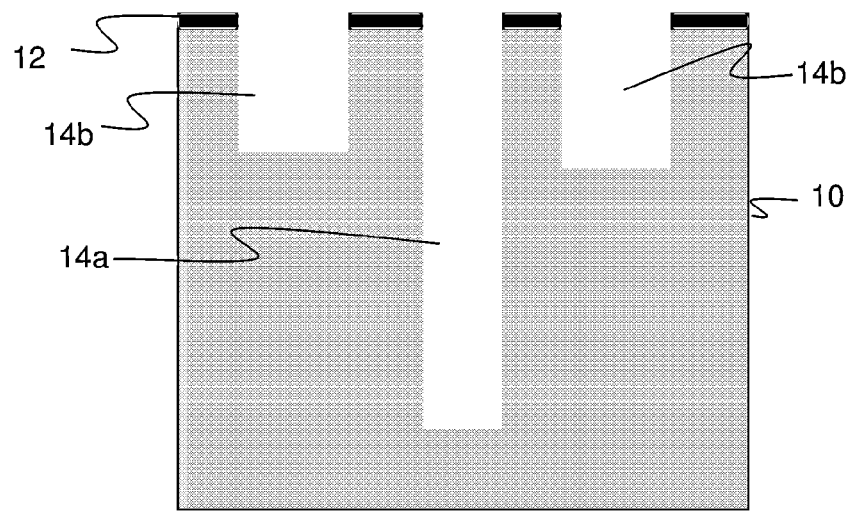
FIGS. 2a-2h show MEMS structures and respective processing steps in accordance with a second aspect of the invention.

FIGS. 2a-2h show structures and respective processing steps in accordance with a second aspect of the invention. More specifically, FIG. 2a shows a starting structure comprising a wafer 10 having a dielectric layer 12. The wafer and dielectric layer were described in the first aspect of the invention.

As further shown in FIG. 2a, vias 14a and 14b are formed from the top side of the wafer 10, using conventional photolithographic processes. In embodiments, three vias 14a, 14b will be used to form the vertical switch of the second aspect of the invention. The vias 14b are shallow vias which are about 5 microns deep, 7 microns in width and about 24 microns in length (i.e., as measured into the figure); whereas, the via 14a is about 140 microns deep, about 3 microns in width and about 20 microns in length (i.e., as measured into the figure). In further embodiments, the via 14a may range from 50 microns to 180 microns in depth, with preferred depths of about 50 microns, 100 microns or 180 microns. Those of skill in the art will recognize that other dimensions are also contemplated by the invention, depending on the particular application of the switch. It should also be understood that the vias 14a and 14b can be formed in different etching (lithographic) processes (as discussed with reference to FIG. 1a).

Figure 2B:
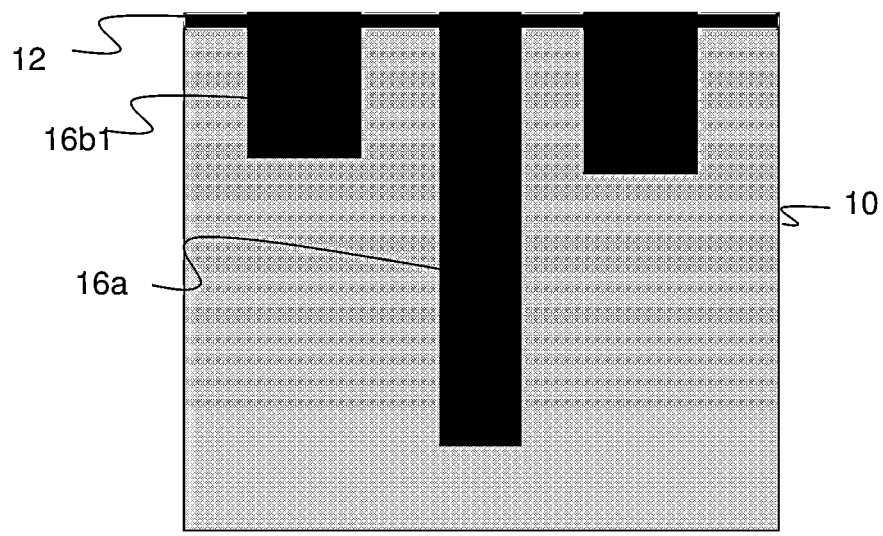

In FIG. 2b, the vias 14a, 14b are filled from the top side of the wafer with known metals or metal alloys to form wire 16a and wire portions 16b1, respectively. In embodiments, the wire 16a and the wire portions 16b1 can be metallized using any known combination of processes such as, such as described in the first aspect of the invention discussion above.

The wire portions 16b1 are about 5 microns deep, 7 microns in width and about 24 microns in length (i.e., as measured into the figure); whereas, the wire 16a is about 140 microns deep, about 3 microns in width and about 20 microns in length (i.e., as measured into the figure). In further embodiments, the wire 16a may range from 50 microns to 180 microns in depth. Those of skill in the art will recognize that other dimensions are also contemplated by the invention, depending on the particular application of the switch.

Figure 2C:
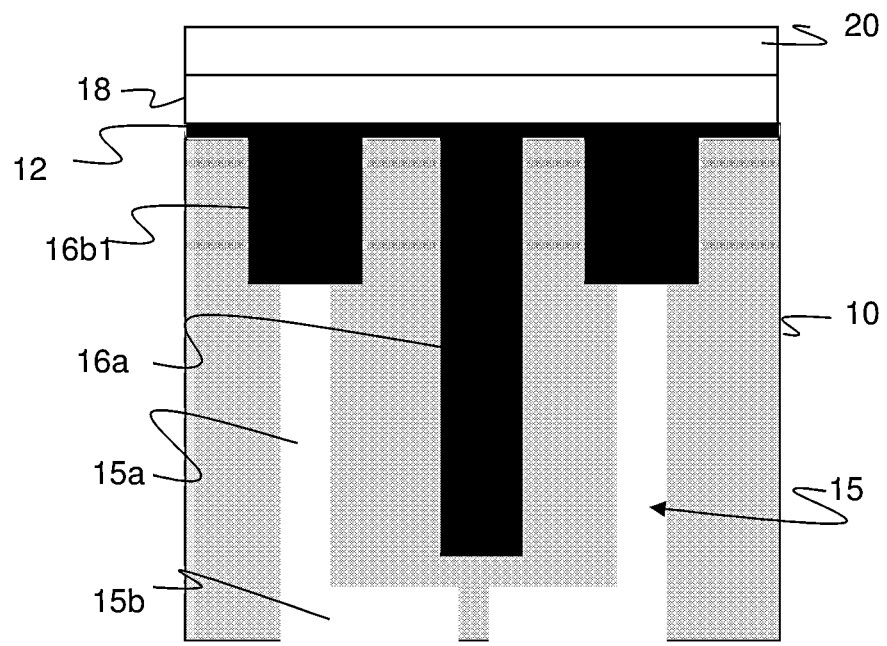

In FIG. 2c, an adhesive 18 is deposited on the structure of FIG. 2b and a carrier 20 is attached, as described in the first aspect of the invention above.

FIG. 2c further shows a dual damascene process to form vias 15. The dual damascene process, as should be understood by those of skill in the art, will form trenches of different depths. In embodiments, the trenches 15 will include a downward extending leg 15a of a first dimension and a horizontally extending leg 15b of a second dimension. The horizontally extending legs 15b are arranged to extend toward one another, with a space therebetween.

Figure 2D:
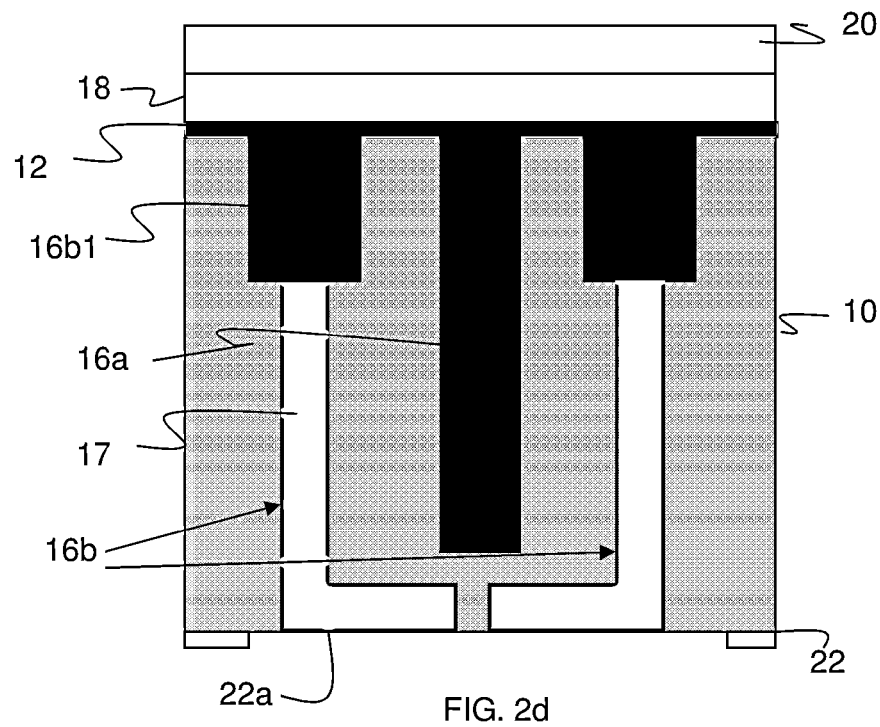

In FIG. 2d, the trenches 15 are filled from the backside of the wafer 10 with metal 17 to complete the metal wires, generally shown at reference numeral 16b. In embodiments, the metal 17 can be TiN and tungsten deposited using a conventional CVD or ALD process; although other processes and metals or combinations thereof are also contemplated by the present invention. A dielectric material 22 is deposited on the backside of the wafer 10, and patterned to form an opening 22a. The dielectric material 22 can be, for example, SiO$_2$. The opening 22a exposes the wires 16b on the backside of the wafer 10.

Figure 2E:
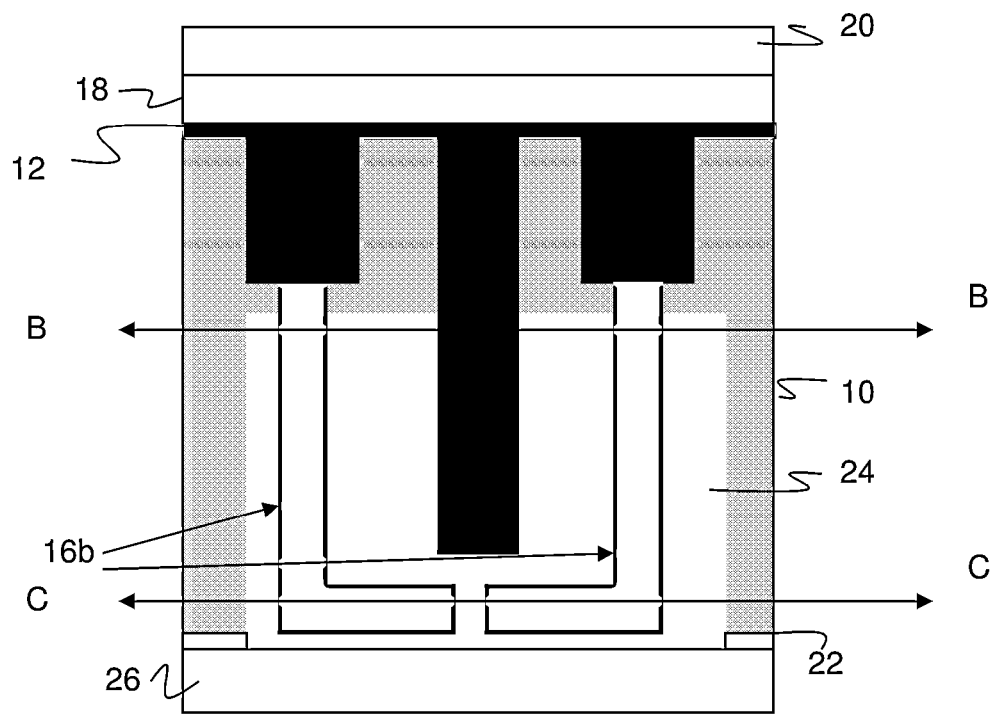

In FIG. 2e, the backside of the wafer 10 can be etched using, for example, a combination of wet and dry etching processes to form void 24 using methods such as those described above. In embodiments, heated potassium hydroxide (KOH) solutions can be used to etch the wafer 10 to form the void 24. In embodiments, the dielectric material 22 will protect outer portions of the wafer 10; however, in this aspect of the invention, the outer wires 16b are substantially exposed in the void 24 in order to allow movement thereof.

In FIG. 2e, an optional wafer cap 26 is bonded to the underside of the wafer 10, using methods described in the first aspect of the invention above.

Figures 2F, 2G:
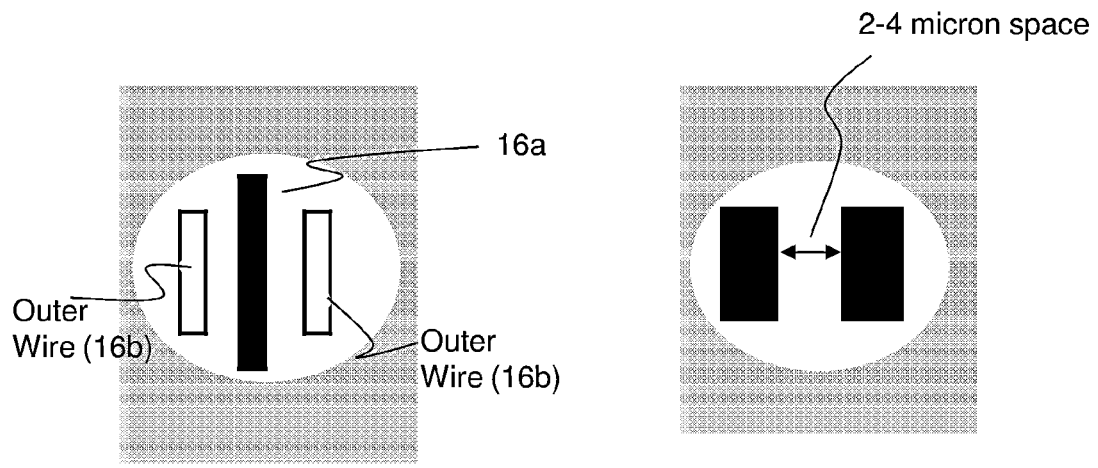

FIG. 2f shows a cross-sectional view of the structure of FIG. 2e, along line B-B. This view more clearly shows the length of the middle wire 16a e.g., about 20 to 100 microns. This view also shows that the outer wires 16b are exposed in the void 24 in order to allow movement thereof.

FIG. 2g shows a cross-sectional view of the structure of FIG. 2e, along line C-C. This view more clearly shows that the portions of the wires formed in the vias 15b extend toward one another. The space between the portions of the wires formed in the vias 15b is about 2 to 4 microns.

Figure 2H:
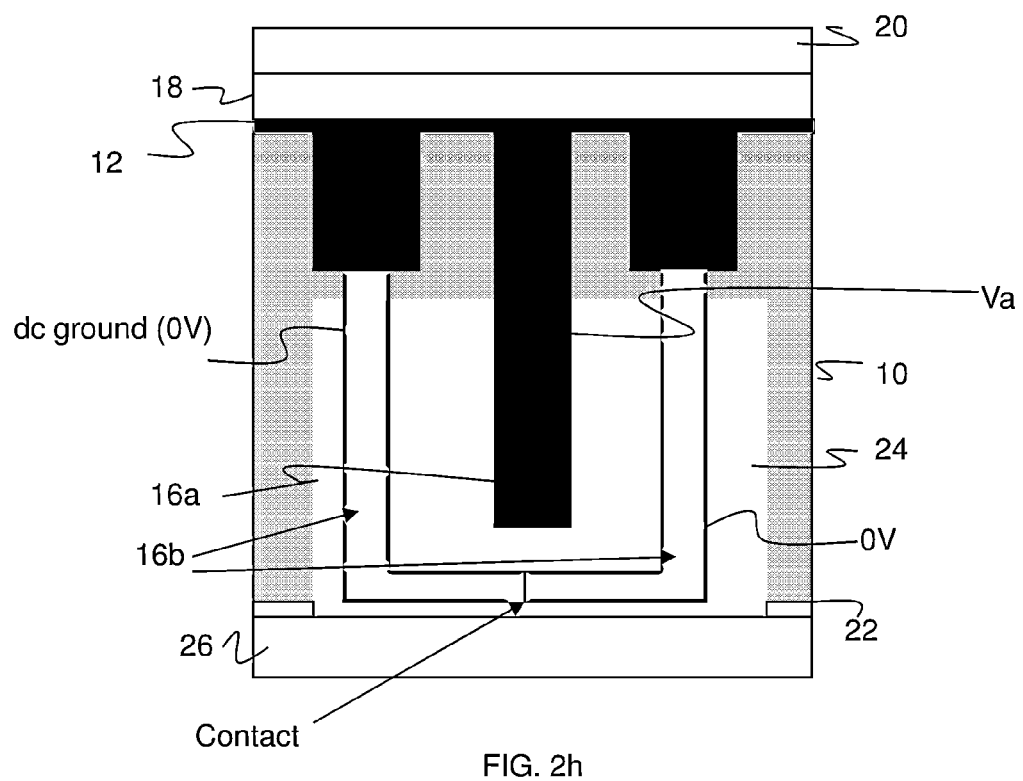

FIG. 2h shows the switch of the second aspect of the invention in the closed position. In this embodiment, an actuation voltage, Va, is applied to the middle wire 16a. In embodiments, the actuation voltage Va is 100 volts applied to the middle wire 16a. The movable electrodes are at dc ground. This results in a coulomb force which pulls the outer wires into contact with one another. This effectively closes the switch, e.g., allows the outer wires 16b to make contact.

Third Aspect of the Invention

Figure 3:
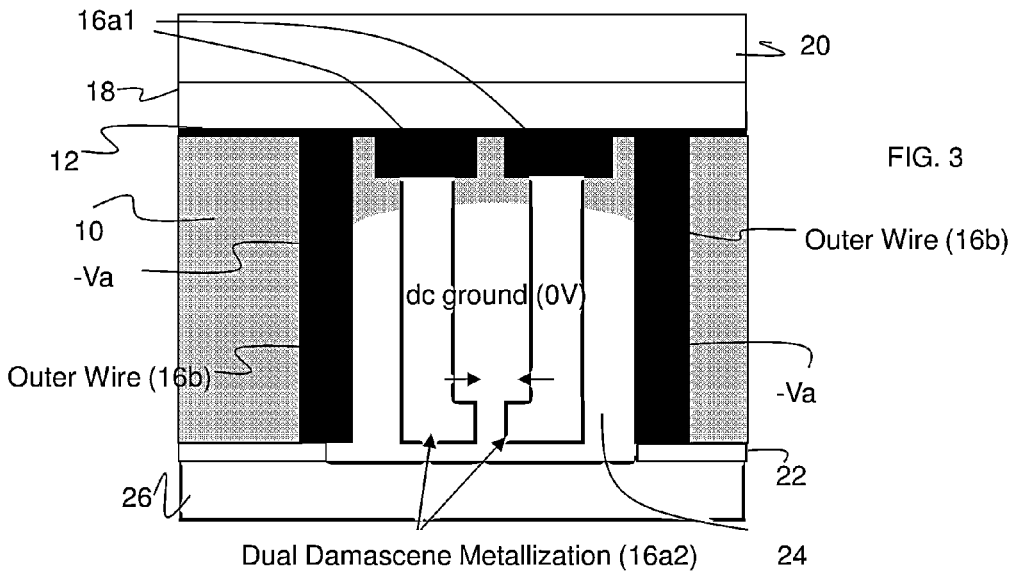
FIG. 3 shows a final MEMS structure and respective processing steps in accordance with a third aspect of the invention.

FIG. 3 shows a final MEMS structure and respective processing steps in accordance with a third aspect of the invention. In FIG. 3, wire portions 16a1 and wires 16b are formed from the top side of the wafer 10 using conventional lithographic and metallization process as discussed above. The inner wires 16a1 are formed using shallow vias (shallower than the vias used to form the outer wires the wires 16b). The depth of the shallow vias can vary depending on the particular application. For example, the shallow via can be about 10 microns and the vias used to form the outer wires 16b may be about 150 microns in depth; although other dimensions are contemplated by the invention. Those of skill in the art should also understand that the vias used for forming the wires 16a1 and 16b may be formed in separate lithographic processes. The vias can be filled from the top side of the wafer with metal or combination of metal such as, for example, titanium nitride or tungsten.

An adhesive 18 and carrier 20 are formed on the dielectric material 12 and exposed portions of the wires on the top side of the wafer, using the methods described in the above noted aspects of the invention.

After a grinding process to expose the bottom portions of the wires 16b, a conventional dual damascene process can be performed from the underside of the wafer to form the metallization 16a2, connecting to the wire portions 16a1. The backside of the wafer 10 can be etched using, for example, a combination of wet and dry etching processes to form the openings 24, as described in above aspects of the invention. In embodiments, the dielectric material 22 will protect outer portions of the wafer 10 to such an extent that at least one side of the outer wires 16b remain attached (fixed) to the material of the wafer 10; whereas, the inner wires 16a1, 16a2 are substantially exposed in the void 24 in order to allow movement thereof. An optional wafer cap 26 can be bonded to the underside of the wafer 10 to create a hermetic seal, using the methods described in the above aspects of the invention.

As shown in FIG. 3, an actuation voltage Va is applied to the fixed wires 16b and the movable electrodes 16a1 is at dc ground. In embodiments, the actuation voltage Va is −100 volts. This results in a coulomb repulsion force which pushes the inner wires 16a2 into contact with one another. This effectively closes the switch, e.g., moves the inner, freely floating wires 16a2 into contact.

Fourth Aspect of the Invention

Figure 4:
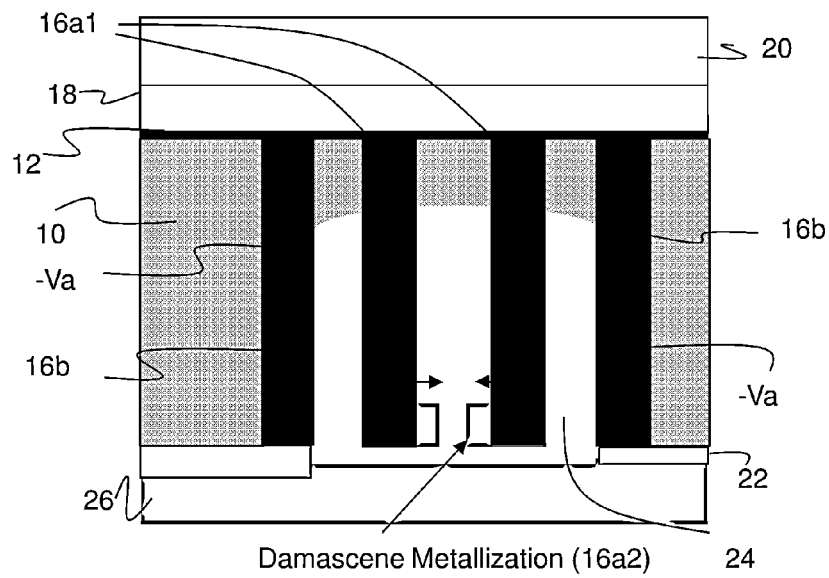
FIG. 4 shows a final MEMS structure and respective processing steps in accordance with a fourth aspect of the invention.

FIG. 4 shows another MEMS structure and respective processing steps in accordance with a fourth aspect of the invention. In FIG. 4, wires 16a1 and 16b are formed from the top side of the wafer 10 using conventional lithographic and metallization process as discussed above. The vias and resulting wires 16a1, 16b can be of various dimensions as discussed above with respect to, for example, the first aspect of the invention. The vias can be filled from the top side of the wafer 10 with metal or combination of metals such as, for example, ALD titanium nitride and CVD tungsten using the methods described in the above aspects of the invention. An adhesive 18 is formed on the dielectric material 12 and exposed portions of the wires on the top side of the wafer and a carrier 20 is attached to the adhesive 18 using the methods described in the above aspects of the invention.

After a grinding process to expose the bottom portions of the wires 16a1, 16b, a conventional etching and metallization process can be performed from the underside of the wafer 10 to form the inner wire portions 16a2, connecting to the wire portions 16a1 using the methods described in the above aspects of the invention. In embodiments, the dielectric material 22 will protect outer portions of the wafer 10 to such an extent that at least one side of the outer wires 16b remain attached (fixed) to the material of the wafer 10; whereas, the inner wires 16a1, 16a2 are substantially exposed in the void 24 in order to allow movement thereof.

An optional wafer cap 26 can be bonded to the underside of the wafer 10 to create a hermetic seal using the methods described in the above aspects of the invention.

In FIG. 4, an actuation voltage Va is applied to the fixed wires 16b and the movable electrodes 16a2 is at dc ground. In embodiments, the actuation voltage Va is −100 volts. This results in a coulomb repulsion force which pushes the inner wires 16a2 into contact with one another. This effectively closes the switch, e.g., moves the inner, freely floating wires 16a2 into contact.

Fifth Aspect of the Invention

Figure 5A:
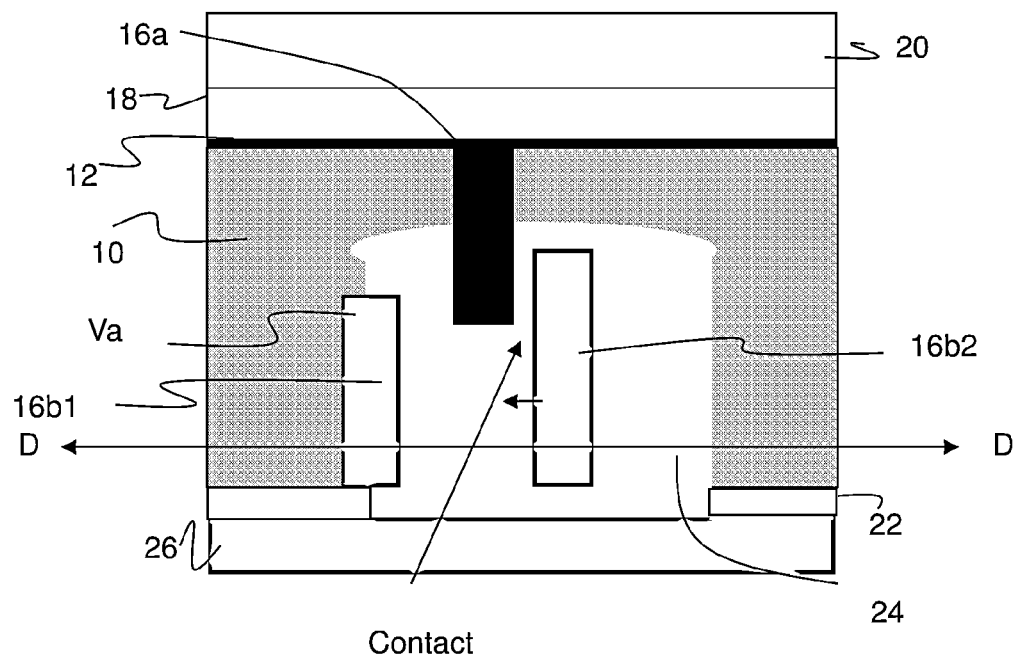
FIGS. 5a and 5b show a final MEMS structure and respective processing steps in accordance with a fifth aspect of the invention.
Figure 5B:
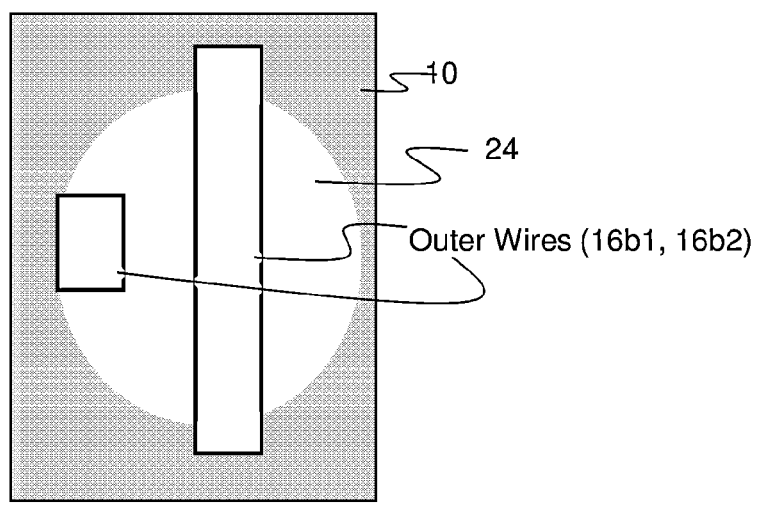

FIGS. 5a and 5b show another MEMS structure and respective processing steps in accordance with a fifth aspect of the invention. In FIG. 5a, wire 16a is formed from the top side of the wafer 10 using conventional lithographic and metallization processes as discussed above. The via used to form the wire 16a from the top side of the wafer may be about 80 microns in depth; although other dimensions are contemplated by the invention. The via can be filled from the top side of the wafer 10 with metal or combination of metals such as, for example, ALD titanium nitride and CVD tungsten, followed by CMP.

An adhesive 18 is formed on the dielectric material 12 and exposed portions of the wires on the top side of the wafer. A carrier 20 is attached to the adhesive 18 using the methods described in the above aspects of the invention.

A conventional lithographic and metallization process is performed from the underside of the wafer to form the outer wires 16b1, 16b2. The backside of the wafer 10 can then be etched using, for example, a combination of wet and dry etching processes to form void 24. In embodiments, heated potassium hydroxide (KOH) solutions can be used to etch the wafer 10 to form the void 24. In embodiments, the dielectric material 22 will protect outer portions of the wafer 10 to such an extent that at least outer wire 16b1 remains attached (fixed) to the material of the wafer 10; whereas, the inner wire 16a and the outer wire 16b2 are substantially exposed in the void 24 in order to allow movement of wire 16a. An optional wafer cap 26 can be bonded to the underside of the wafer 10 to create a hermetic seal using the methods described in the above aspects of the invention.

As shown in FIG. 5a (or 5b), an actuation voltage Va is applied to the fixed wire 16b1 and the movable wires 16a and 16b are at dc ground. In embodiments, the actuation voltage Va is 100 volts. This results in a coulomb force which pushes the wire 16a towards and in contact with the inner wire 16b2.

This effectively closes the switch, e.g., moves the wire 16a into contact with the wire 16b2.

Sixth Aspect of the Invention

Figure 6A:
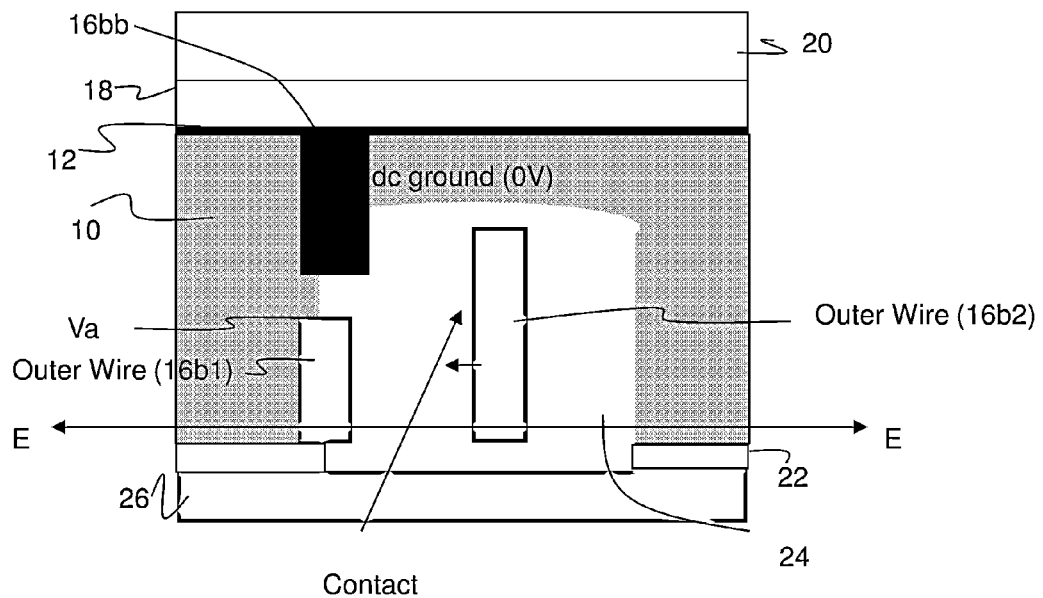
FIGS. 6a and 6b show a final MEMS structure and respective processing steps in accordance with a sixth aspect of the invention.
Figure 6B:
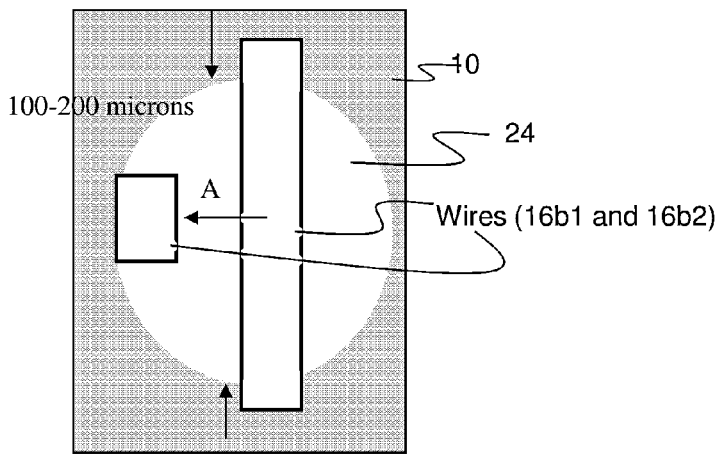

FIGS. 6a and 6b show another MEMS structure and respective processing steps in accordance with a sixth aspect of the invention. In FIG. 6a, outer wire 16bb is formed from the top side of the wafer 10 using conventional lithographic and metallization processes as discussed above. The via used to form the wire 16bb from the top side of the wafer may be about 80 microns in depth; although other dimensions are contemplated by the invention. The via can be filled from the top side of the wafer 10 with metal or combination of metals such as, for example, ALD titanium nitride and CVD tungsten followed by CMP.

An adhesive 18 is formed on the dielectric material 12 and exposed portions of the wires on the top side of the wafer. A carrier 20 is attached to the adhesive 18 using the methods described in the above aspects of the invention.

A conventional lithographic and metallization process is performed from the underside of the wafer to form the outer wires 16b1, 16b2. The outer wire 16b1 is in substantial alignment with the wire 16bb. The backside of the wafer 10 can then be etched using, for example, a combination of wet and dry etching processes to form void 24 as previously described. In embodiments, heated potassium hydroxide (KOH) solutions can be used to etch the wafer 10 to form the void 24.

In embodiments, the dielectric material 22 will protect outer portions of the wafer 10 to such an extent that at least one side of outer wire 16b1 and outer wire 16bb remain attached (fixed) to the material of the wafer 10; whereas, the other outer wire 16b2 is substantially exposed in the void 24 in order to allow movement thereof. An optional wafer cap 26 can be bonded to the underside of the wafer 10 to create a hermetic seal. The wafer cap 26 can be, for example, a glass. The wafer cap 26 can be bonded to the dielectric material 22 using any conventional bonding process, as previously described.

In FIG. 6a (or 6b), an actuation voltage Va is applied to the fixed wire 16b1 and the movable wires 16a and 16b are at dc ground. In embodiments, the actuation voltage Va is 100 volts applied to the fixed outer wire 16b1. This results in a coulomb force which pulls the other (floating) outer wire 16b2 towards and into contact with the wire 16bb. This effectively closes the switch.

FIG. 6b shows exemplary dimensions of the structure of the invention. For example, vertical dimension of the void 24 can range from about 100 microns to about 200 microns. The distance between the wires 16b1 and 16b2 is about 1 micron. In embodiments, the moveable wire 16b2 is embedded, at its ends, in the wafer 10. As the wires is very long, e.g., at least a length expanding the vertical distance of the void, as a voltage is applied to the fixed wire 16b1, a portion of the moveable wire (e.g., middle portion which is proximate to the fixed wire 16b1) will move towards the fixed wire 16b1 and make contact therewith, as shown by arrow "A" in FIG. 6b.

Seventh Aspect of the Invention

Figure 7:
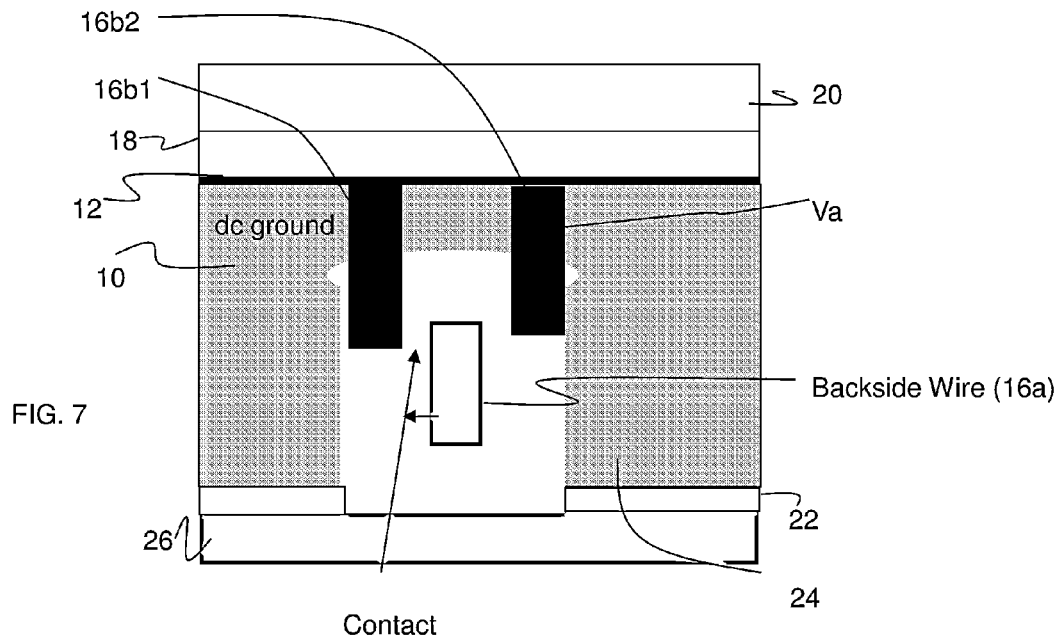
FIG. 7 shows a final MEMS structure and respective processing steps in accordance with a seventh aspect of the invention.

FIG. 7 shows another MEMS structure and respective processing steps in accordance with a seventh aspect of the invention. In FIG. 7, wires 16b1, 16b2 are formed from the top side of the wafer 10 using conventional lithographic and metallization processes as discussed above. The via used to form the wires 16b1, 16b2 from the top side of the wafer may be about 50 microns in depth; although other dimensions are contemplated by the invention. The vias can be filled from the top side of the wafer 10 with metal or combination of metals such as, for example, ALD titanium nitride and CVD tungsten, followed by CMP.

An adhesive 18 is formed on the dielectric material 12 and exposed portions of the wires on the top side of the wafer. A carrier 20 is attached to the adhesive 18 using the methods described in the above aspects of the invention.

A conventional lithographic process is performed from the underside of the wafer to form the inner wire 16a (offset from wires 16b1, 16b2). The backside of the wafer 10 can then be etched using, for example, a combination of wet and dry etching processes to form void 24. In embodiments, heated potassium hydroxide (KOH) solutions can be used to etch the wafer 10 to form the void 24. In embodiments, the dielectric material 22 will protect outer portions of the wafer 10 to such an extent that at least one side of one outer wire 16b2 remains attached (fixed) to the material of the wafer 10; whereas, the inner wire 16 and the other outer wire 16b1 are substantially exposed in the void 24 in order to allow movement of at least the outer wire 16b1. An optional wafer cap 26 can be bonded to the underside of the wafer 10 to create a hermetic seal using the methods previously described.

As shown in FIG. 7, an actuation voltage Va is applied to the fixed outer wires 16b2 and the movable electrodes 16a are at dc ground. In embodiments, the actuation voltage Va is 100 volts. This results in a coulomb force which pushes the wire 16b1 into contact with the wire 16a. This effectively closes the switch.

Eighth Aspect of the Invention

Figure 8:
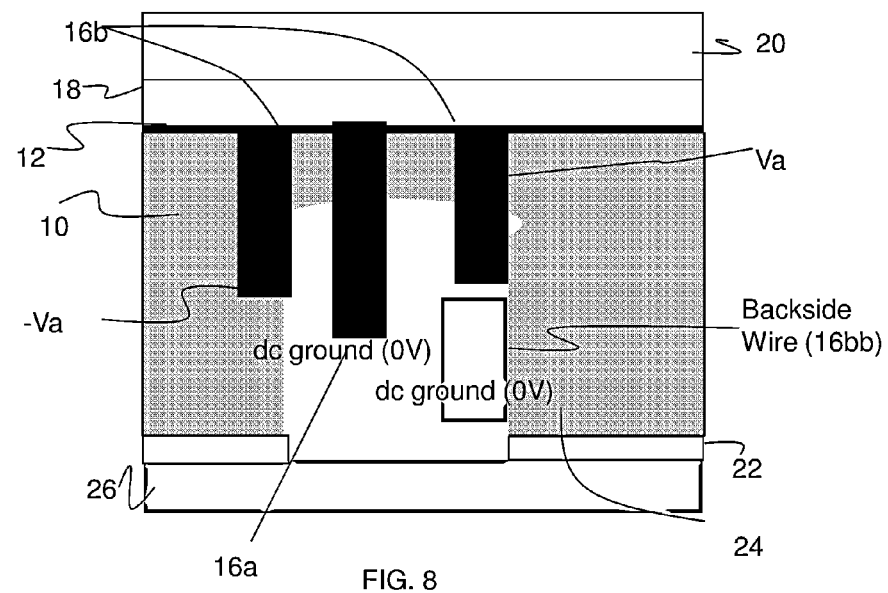
FIG. 8 shows a final MEMS structure and respective processing steps in accordance with an eighth aspect of the invention.

FIG. 8 shows another MEMS structure and respective processing steps in accordance with an eighth aspect of the invention. In FIG. 8, wires 16a and 16b are formed from the top side of the wafer 10 using conventional lithographic and metallization processes as discussed above. In embodiments, the depth of the via used to form the inner wire 16a is deeper than the vias used to form the outer wires 16b. For example, the via used to form the wire 16a may be about 100 microns in depth; although other dimensions are contemplated by the invention. The vias can be filled from the top side of the wafer 10 with metal or combination of metals such as, for example, ALD titanium nitride and CVD tungsten, followed by CMP.

An adhesive 18 is formed on the dielectric material 12 and exposed portions of the wires on the top side of the wafer. A carrier 20 is attached to the adhesive 18 using the methods described in the above aspects of the invention.

A conventional lithographic and metallization process is performed from the underside of the wafer to form the outer wire 16bb. The outer wire 16bb may be aligned with one of the outer wires 16b formed from the top side of the wafer 10. The backside of the wafer 10 can then be etched using, for example, a combination of wet and dry etching processes to form void 24. In embodiments, heated potassium hydroxide (KOH) solutions can be used to etch the wafer 10 to form the void 24.

In embodiments, the dielectric material 22 will protect outer portions of the wafer 10 to such an extent that at least one side of one outer wire 16b and the outer wire 16bb remains attached (fixed) to the material of the wafer 10; whereas, the inner wire 16a is exposed in the void 24 in order to allow movement thereof. The outer fixed wire 16b may also be slightly or fully embedded within the wafer material due to the placement of the dielectric material 22 (as with any embodiment having an outer fixed wire).

An optional wafer cap 26 can be bonded to the underside of the wafer 10 to create a hermetic seal, as discussed previously.

In FIG. 8, an actuation voltage Va is applied to the fixed wire 16b (above wire 16bb) and a minus Va is applied to the other fixed wire 16b. The movable electrode 16a is at dc ground. In embodiments, the actuation voltage Va is 100 volts applied to the fixed wire 16b (above wire 16bb) and −100 applied to the other fixed wire 16b. This results in a coulomb force which moves the wire 16a towards and into contact with the outer wire 16bb. This effectively closes the switch. Also contemplated in this and other aspects of the invention is the use of one or more actuation electrodes.

Ninth Aspect of the Invention

Figure 9:
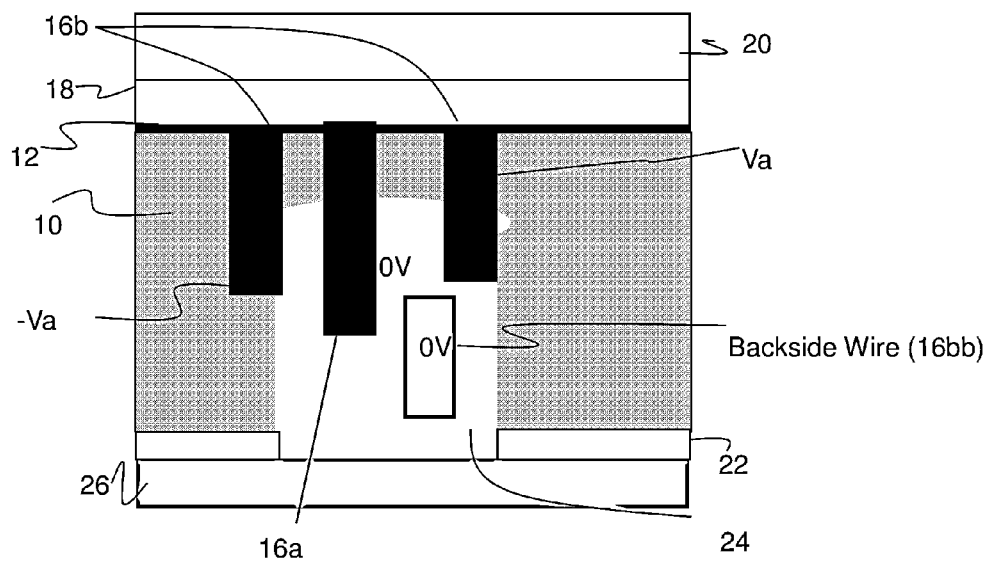
FIG. 9 shows a final MEMS structure and respective processing steps in accordance with a ninth aspect of the invention.

FIG. 9 shows another MEMS structure and respective processing steps in accordance with a ninth aspect of the invention. In FIG. 9, wires 16a and 16b are formed from the top side of the wafer 10 using conventional lithographic and metallization processes as discussed above. In embodiments, the depth of the via used to form the inner wire 16a is deeper than the vias used to form the outer wires 16b. For example, the via used to form the wire 16a may be about 80 microns in depth; although other dimensions are contemplated by the invention. Those of skill in the art should recognize that vias of different depths, in ay of the applicable embodiments, are formed in distinct lithographic process. The vias can be filled from the top side of the wafer 10 with metal or combinations of metals such as, for example, ALD titanium nitride and CVD tungsten, followed by CMP.

An adhesive 18 is formed on the dielectric material 12 and exposed portions of the wires on the top side of the wafer. A carrier 20 is attached to the adhesive 18 using the methods described in the above aspects of the invention.

A conventional lithographic and metallization process is performed from the underside of the wafer to form the outer wire 16bb. The outer wire 16bb may be offset from the outer wires 16b and the inner wire 16a formed from the top side of the wafer 10. The backside of the wafer 10 can then be etched using, for example, a combination of wet and dry etching processes to form void 24. In embodiments, heated potassium hydroxide (KOH) solutions can be used to etch the wafer 10 to form the void 24.

In embodiments, the dielectric material 22 will protect outer portions of the wafer 10 to such an extent that at least one side of one outer wire 16b and the outer wire 16bb remains attached (fixed) to the material of the wafer 10; whereas, the inner wire 16a is exposed in the void 24 in order to allow movement thereof. The outer fixed wire 16b may also be slightly or fully embedded within the wafer material due to the placement of the dielectric material 22 (as with any embodiment having an outer fixed wire). An optional wafer cap 26 can be bonded to the underside of the wafer 10 to create a hermetic seal using the methods discussed previously.

In FIG. 9, an actuation voltage Va is applied to the fixed wire 16b (nearest wire 16bb) and a minus Va is applied to the other fixed wire 16b. The movable electrode 16a is at dc ground. In embodiments, the actuation voltage Va is 100 volts applied to the fixed wire 16b (nearest wire 16bb) and −100 applied to the other fixed wire 16b. This results in a coulomb force which moves the wire 16a towards and into contact with the outer wire 16bb. This effectively closes the switch.

Tenth Aspect of the Invention

Figure 10:
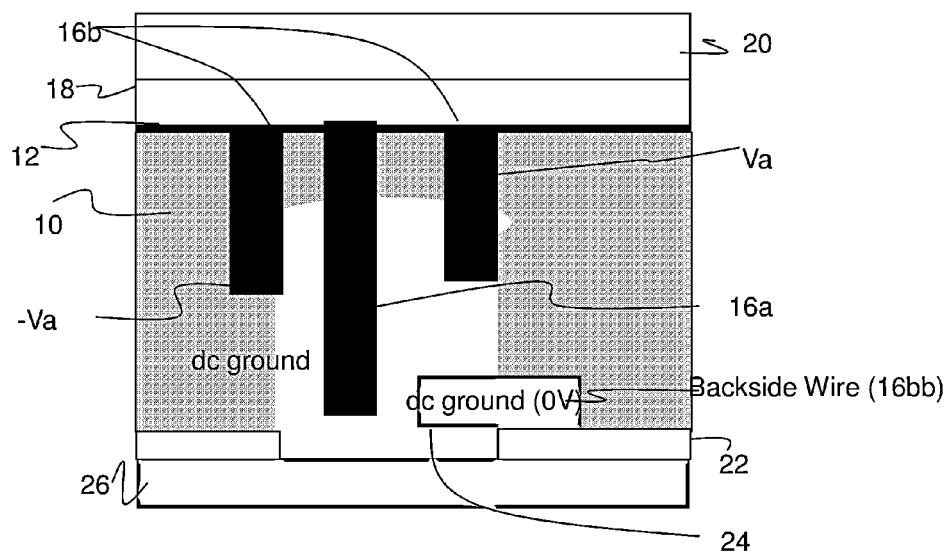
FIG. 10 shows a final MEMS structure and respective processing steps in accordance with a tenth aspect of the invention.

FIG. 10 shows another MEMS structure and respective processing steps in accordance with a tenth aspect of the invention. In FIG. 10, wires 16a and 16b are formed from the top side of the wafer 10 using conventional lithographic and metallization processes as discussed above. The via used to form the wire 16a from the top side of the wafer may be about 150 microns in depth; although other dimensions are contemplated by the invention. The vias used to form the outer wires 16b may be a shallow via of about 10 microns, for example. The vias can be filled from the top side of the wafer 10 with metal or combinations thereof such as, for example, ALD titanium nitride and CVD tungsten, followed by CMP.

An adhesive 18 is formed on the dielectric material 12 and exposed portions of the wires on the top side of the wafer. A carrier 20 is attached to the adhesive 18 using the methods discussed in the previous embodiments.

After a grinding process to expose a bottom portion of the wire 16a, a conventional lithographic and metallization process is performed from the underside of the wafer to form the outer wire 16bb. The outer wire 16bb may be offset from the outer wires 16b and the inner wire 16a formed from the top side of the wafer 10. The outer wire 16bb may also be partly embedded within the wafer material. The backside of the wafer 10 can then be etched using, for example, a combination of wet and dry etching processes to form void 24. In embodiments, heated potassium hydroxide (KOH) solutions can be used to etch the wafer 10 to form the void 24. In embodiments, the dielectric material 22 will protect outer portions of the wafer 10 to such an extent that at least one side of the outer wires 16b and 16bb remains attached (fixed) to the material of the wafer 10; whereas, the inner wire 16a is exposed in the void 24 in order to allow movement thereof. An optional wafer cap 26 can be bonded to the underside of the wafer 10 to create a hermetic seal using methods previously described.

In FIG. 10, an actuation voltage Va is applied to the fixed wire 16b (e.g., the fixed wire 16b above the wire 16bb) and a minus Va is applied to the other outer wire 16b. The movable electrode 16a is at dc ground. In embodiments, the actuation voltage Va is 100 volts applied to one of the fixed wires 16b (e.g., the fixed wire 16b above the wire 16bb) and −100 volts applied to the other outer wire 16b. This results in a coulomb force which moves the freely floating inner wire 16a, which is at dc ground, towards and into contact with the outer wire 16bb. This effectively closes the switch.

Eleventh Aspect of the Invention

Figure 11:
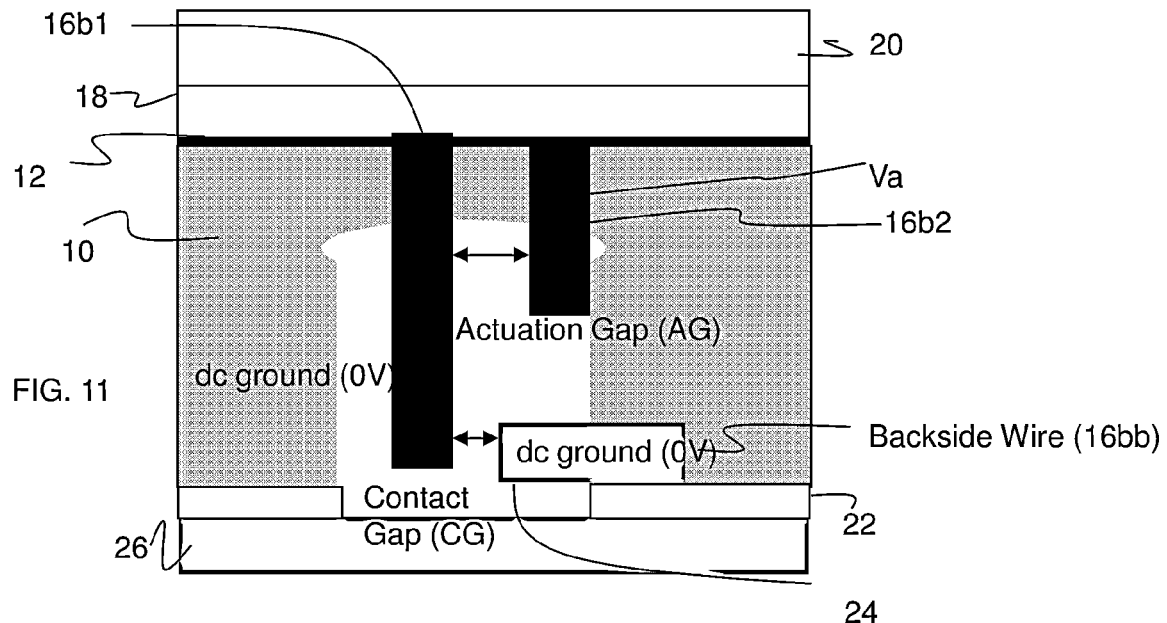
FIG. 11 shows a final MEMS structure and respective processing steps in accordance with an eleventh aspect of the invention.

FIG. 11 shows a final MEMS structure and respective processing steps in accordance with a eleventh aspect of the invention. In FIG. 11, wires 16b1, 16b2 are formed from the top side of the wafer 10 using conventional lithographic and metallization process as discussed above. A via for the outer wire 16b1 exposed in void 24 is deeper than the other via formed for the fixed outer wire 16b2. The depth of the via and resulting wire can vary depending on the particular application. For example, the via used to form the freely floating wire 16b1 may be about 150 microns in depth; although other dimensions are contemplated by the invention. The vias can be filled from the top side of the wafer 10 with metal such as, for example, ALD titanium nitride and CVD tungsten, followed by CMP.

An adhesive 18 is formed on the dielectric material 12 and exposed portions of the wires on the top side of the wafer. A carrier 20 is attached to the adhesive 18 using the methods discussed in the previous embodiments.

After a grinding process, a conventional lithographic and metallization process is performed from the underside of the wafer to form the outer wire 16bb, which may be offset from the outer wires 16b1, 16b2 and the inner wire 16a formed from the top side of the wafer 10. The wire 16bb may be partly embedded within the material of the wafer. The backside of the wafer 10 can then be etched using, for example, a combination of wet and dry etching processes to form void 24. In embodiments, heated potassium hydroxide (KOH) solutions can be used to etch the wafer 10 to form the void 24. In embodiments, the dielectric material 22 will protect outer portions of the wafer 10 to such an extent that at least one side of one outer wire 16b2 remains attached (fixed) to the material of the wafer 10 and the outer wire 16bb remains at least partly embedded within the wafer material; whereas, the outer wire 16b1 is exposed in the void 24 in order to allow movement thereof. An optional wafer cap 26 can be bonded to the underside of the wafer 10 to create a hermetic seal using methods discussed previously.

MEMS contact switch functionality is defined by a pull-in voltage and an actuation voltage. The pull-in voltage is defined by the applied actuator voltage needed for the beam to bend and make contact and the actuation voltage is the applied voltage in MEMS switch circuit, which by definition is greater than the pull-in voltage. With this understanding, the structure of FIG. 11 includes an actuation gap (AG) and contact gap (CG). The actuation gap (AG) is the separation between the actuator and the beam (e.g., separation between 16b1 and 16b2). The contact gap (CG) is the separation between the movable beam and the contact (e.g., separation between beam 16b1 and beam 16bb). It should be understood by those of skill in the art that each aspect of the invention includes an actuation gap (AG) and contact gap (CG).

In the example of FIG. 11, the MEM beam is actuated or moved into contact by applying a dc ground to the beam 16b1 and a dc actuation voltage to the actuator 16bb, as discussed in more detail below. To avoid shorting the beam 16b1 and the actuator 16bb, which would result in arcing and potential destruction of the MEMS switch, the contact gap (CG) is typically less than the actuation gap (AG).

Being more specific, in FIG. 11, an actuation voltage Va is applied to the fixed outer wire 16b2. In embodiments, the actuation voltage Va is 100 volts applied to the fixed outer wire 16b2. This results in a coulomb force which moves the outer wire 16b1, which is at dc ground, towards and into contact with the outer wire 16bb. This effectively closes the switch.

Graph of Data Points

Figure 12:
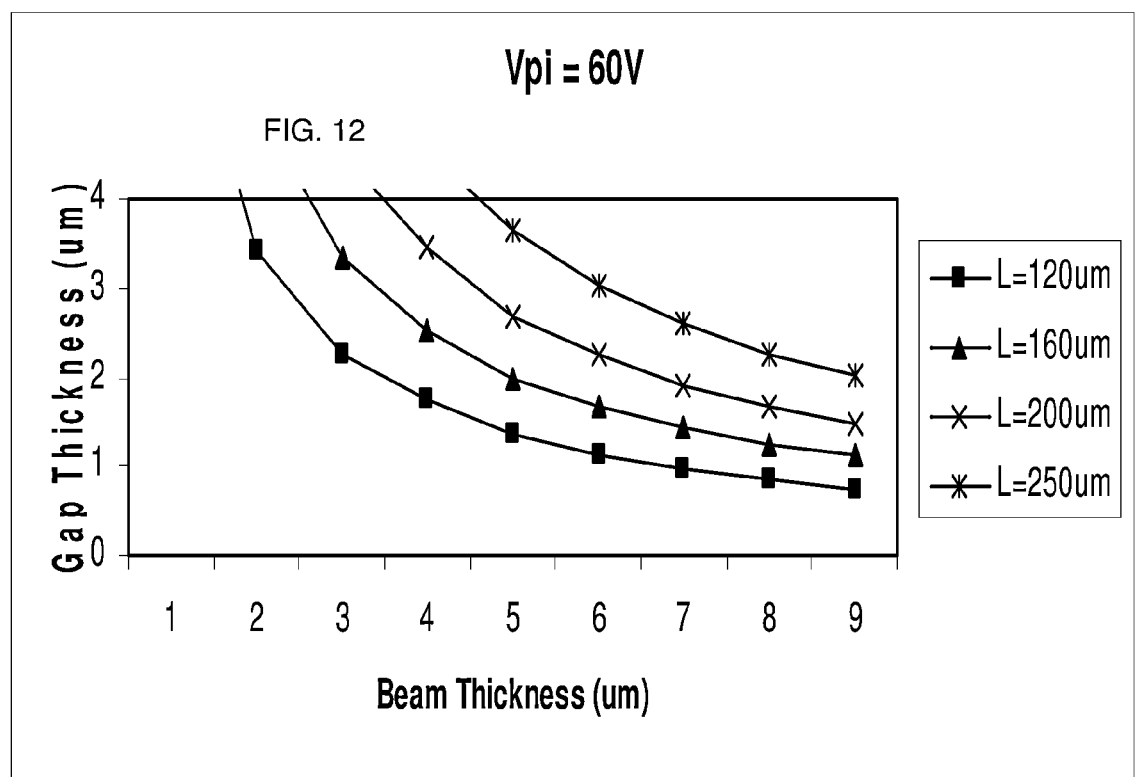
FIG. 12 is a graph of data points for an aluminum cantilever beam showing beam thickness, beam length, and actuation gap for beams with a 60V pull-in voltage in accordance with the invention.

FIG. 12 is a graph of calculated data points for an aluminum cantilever beam showing beam thickness, beam length, and actuation gap for beams with a 60V pull-in voltage in accordance with the invention. The data points were calculated using a 1997 paper by Osterberg and Senturia. The data points in the graph of FIG. 12 are provided as an exemplary illustration showing various gap and beam thicknesses for various beam lengths of, for example, 120 microns, 160 microns, 200 microns and 250 microns. In general, the pull-in voltage increases as the beam thickness increases, the beam length decreases, and as the actuation gap thickness increases. These calculations apply to the single vertical cantilever beams described in, for example, FIG. 11. Of course, these same or similar data points are qualitatively relevant for any of the single cantilever beams described in the invention, including the double cantilever beams in, for example, FIG. 4. Those of skill in the art should realize that the vertical cantilever beams described in the present invention can have other ranges in beam thickness, actuation gap thickness, contact gap thickness, and beam lengths targeting specific pull-in voltage requirements.

Design Structure

Figure 13:
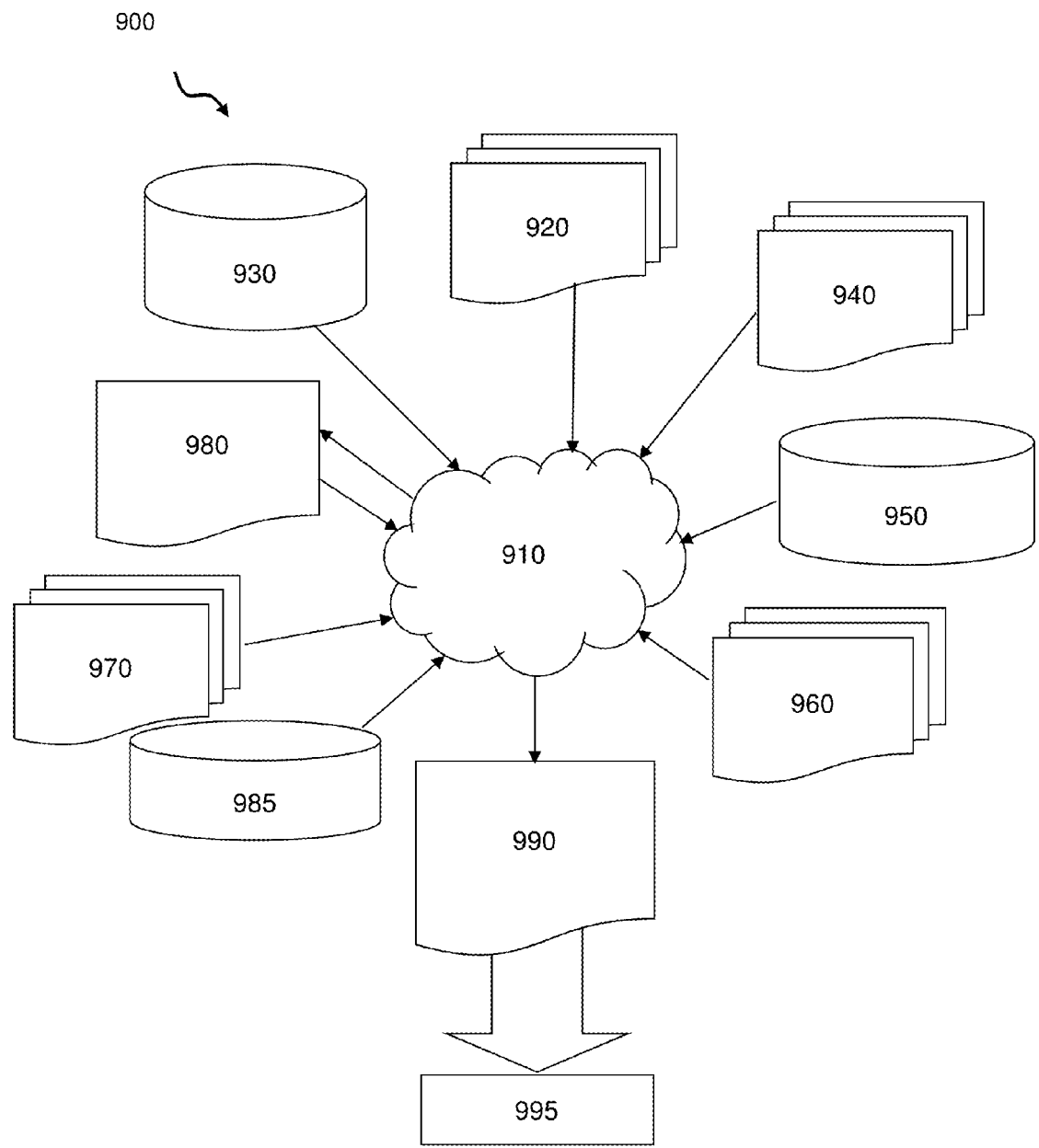
FIG. 13 is a flow diagram of a design process used in semiconductor design, manufacture, and/or test.

FIG. 13 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1a-1l. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1a-1l to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1a-1l. In one embodiment, design structure 990 may comprise a compiled, executable HDL simulation model that functionally simulates the devices shown in FIGS. 1a-1l.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1a-1l. Design structure 990 may then proceed to a stage 995 where, for example, design structure 990: proceeds to tape-out, is released to manufacturing, is released to a mask house, is sent to another design house, is sent back to the customer, etc.

The methods as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A MEMS switch, comprising:
   at least two vertically extending metal wires formed in a wafer; and
   a void formed in the wafer which accommodates at least one of the at least two vertically extending metal wires,
   wherein the at least one of the at least two vertically extending metal wires is moveable within the void upon an application of a voltage, and
   the at least two vertically extending metal wires are four wires and the at least one wire is two inner wires which are moveable within the void upon an application of the voltage.

2. The MEMS switch of claim 1, wherein the at least two inner wires are formed from a bottom side of the wafer.

3. The MEMS switch of claim 1, wherein the void is hermetically sealed.

4. A MEMS switch, comprising:
   at least two vertically extending metal wires formed in a wafer; and
   a void formed in the wafer which accommodates at least one of the at least two vertically extending metal wires,
   wherein the at least one of the at least two vertically extending metal wires is moveable within the void upon an application of a voltage, and
   wherein the at least one of the at least two vertical extending metal wires are three vertically extending metal wires, with a middle wire longer than two outer wires.

5. A MEMS switch, comprising:
   at least two vertically extending metal wires formed in a wafer; and
   a void formed in the wafer which accommodates at least one of the at least two vertically extending metal wires,
   wherein the at least one of the at least two vertically extending metal wires is moveable within the void upon an application of a voltage, and
   wherein the at least two vertically extending metal wires are three vertically extending metal wires with two fixed to the wafer and partially exposed to the void.

6. A MEMS switch, comprising:
   at least two vertically extending metal wires formed in a wafer; and
   a void formed in the wafer which accommodates at least one of the at least two vertically extending metal wires,
   wherein the at least one of the at least two vertically extending metal wires is moveable within the void upon an application of a voltage, and
   wherein the at least two vertically extending metal wires are four vertically extending wires, two inner wires of the four vertically extending wires are moveable within the void in order to make contact with one another.

7. The MEMS switch of claim 6, further comprising two wire extensions in contact with the two inner wires, respectively, of the four vertically extending wires.

8. The MEMS switch of claim 7, wherein the two wire extensions are moveable within the void in order to make contact with one another.

9. A MEMS switch, comprising:
   at least two vertically extending metal wires formed in a wafer; and
   a void formed in the wafer which accommodates at least one of the at least two vertically extending metal wires,
   wherein the at least one of the at least two vertically extending metal wires is moveable within the void upon an application of a voltage, and
   wherein the at least two vertically extending metal wires are three vertically extending metal wires such that a middle of the three vertically extending wires is freely moveable within the void to make contact with a separate wire from a bottom side of the wafer.

* * * * *